(12) United States Patent
Iwamoto et al.

(10) Patent No.: US 11,561,433 B2
(45) Date of Patent: Jan. 24, 2023

(54) LIQUID CRYSTAL DISPLAY DEVICE HAVING LIQUID DISPLAY PANEL AND BACKLIGHT DEVICE EMITTING LIGHT TOWARD BACK SURFACE OF LIQUID CRYSTAL DISPLAY PANEL, AND METHOD FOR PRODUCING SAME

(71) Applicant: SAKAI DISPLAY PRODUCTS CORPORATION, Sakai (JP)

(72) Inventors: Kenichi Iwamoto, Sakai (JP); Mayumi Hori, Sakai (JP); Kazuhiko Negoro, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 154 days.

(21) Appl. No.: 17/254,243

(22) PCT Filed: Jun. 22, 2018

(86) PCT No.: PCT/JP2018/023850
§ 371 (c)(1),
(2) Date: Dec. 18, 2020

(87) PCT Pub. No.: WO2019/244351
PCT Pub. Date: Dec. 26, 2019

(65) Prior Publication Data
US 2021/0271135 A1    Sep. 2, 2021

(51) Int. Cl.
*G02F 1/13357* (2006.01)
*G02F 1/1335* (2006.01)
*H01L 33/50* (2010.01)

(52) U.S. Cl.
CPC .. *G02F 1/133605* (2013.01); *G02F 1/133603* (2013.01); *G02F 1/133607* (2021.01); *H01L 33/502* (2013.01)

(58) Field of Classification Search
CPC ......... G02F 1/133605; G02F 1/133603; G02F 1/133607; H01L 33/502
See application file for complete search history.

(56) References Cited

U.S. PATENT DOCUMENTS

| 2007/0058357 A1 | 3/2007 | Yamaguchi et al. |
| 2016/0170101 A1* | 6/2016 | Kivel .................. G02B 5/3041 359/359 |

(Continued)

FOREIGN PATENT DOCUMENTS

| JP | 2007-081234 A | 3/2007 |
| JP | 2010250259 A * | 11/2010 |

(Continued)

OTHER PUBLICATIONS

Daikan et al., JP 2010-250259, machine translation (Year: 2010).*

*Primary Examiner* — Tracie Y Green
(74) *Attorney, Agent, or Firm* — ScienBiziP, P.C.

(57) ABSTRACT

A liquid crystal display device (100) according to the present invention is provided with a liquid crystal display panel (10) and a backlight device (50) which emits light toward the back surface (10*r*) of the liquid crystal display panel. The backlight device comprises: an LED substrate (21) that has a front surface (21*s*) on which a plurality of LED chips (22) are arranged so as to emit excitation light toward the back surface of the liquid crystal display panel; a phosphor layer (25) which contains a phosphor (25*q*) that emits fluorescent light upon reception of the excitation light; a wavelength selective reflection layer (28) which is arranged between the phosphor layer and the LED substrate, and wherein the transmittance of the excitation light is higher than the transmittance of the fluorescent light; and an optical layer laminate (30) which is arranged on the liquid crystal display panel side of the phosphor layer. The optical layer laminate, the phosphor layer and the wavelength selective reflection (Continued)

layer are affixed to the back surface of the liquid crystal display panel in an integrated manner, with a plurality of adhesive layers including a first adhesive layer (40*a*) being interposed therebetween.

21 Claims, 8 Drawing Sheets

(56) References Cited

U.S. PATENT DOCUMENTS

| | | | |
|---|---|---|---|
| 2016/0349573 A1* | 12/2016 | Oh | ............................ G02B 1/14 |
| 2017/0115528 A1* | 4/2017 | Oh | ..................... G02F 1/133536 |
| 2017/0138548 A1 | 5/2017 | Kurita | |
| 2017/0357119 A1 | 12/2017 | Kim et al. | |
| 2018/0180794 A1* | 6/2018 | Harada | ................. G02B 5/0221 |
| 2018/0188610 A1* | 7/2018 | Shimizu | ................ G09G 3/3607 |
| 2018/0292712 A1* | 10/2018 | Kishimoto | ............... F21V 13/14 |

FOREIGN PATENT DOCUMENTS

| | | |
|---|---|---|
| JP | 2017-068248 A | 4/2017 |
| JP | 2017-084761 A | 5/2017 |
| JP | 2017-091866 A | 5/2017 |
| JP | 2017-162726 A | 9/2017 |
| JP | 2017-219846 A | 12/2017 |

* cited by examiner (a)

(b)

(a)

(b)

(a)

(b)

LIQUID CRYSTAL DISPLAY DEVICE HAVING LIQUID DISPLAY PANEL AND BACKLIGHT DEVICE EMITTING LIGHT TOWARD BACK SURFACE OF LIQUID CRYSTAL DISPLAY PANEL, AND METHOD FOR PRODUCING SAME

TECHNICAL FIELD

The present invention relates to a liquid crystal display apparatus and a method for manufacturing the same, and particularly relates to a liquid crystal display apparatus having an LED backlight and a method for manufacturing the same.

BACKGROUND ART

Many liquid crystal display apparatuses that are currently commercially available have a backlight device including a plurality of LEDs. For example, the plurality of LEDs are divided into a plurality of regions, and only the LEDs of regions where illumination light is needed are lit, or each region is adjusted to the brightness needed therein. Such a method for driving the backlight is referred to as split drive, partial drive, area dimming or local dimming. Employing the split drive method, it is possible to improve the brightness contrast ratio of between light and dark areas of the liquid crystal display apparatus.

In recent years, liquid crystal display apparatuses that are compatible with high dynamic range (hereinafter referred to as "HDR") have been on the market in order to improve the display quality of display apparatuses.

Moreover, liquid crystal display apparatuses that suppress color non-uniformity by employing a remote phosphor configuration and using a dichroic filter, as described in Patent Document Nos. 1 and 2, have been researched as liquid crystal display apparatuses compatible with UHD Premium standard (color reproduction: 90% or higher of BT2020 standard, HDR10 standard).

CITATION LIST

Patent Literature

Patent Document No. 1: Japanese Laid-Open Patent Publication No. 2017-84761
Patent Document No. 2: Japanese Laid-Open Patent Publication No. 2007-81234

SUMMARY OF INVENTION

Technical Problem

An object of the present invention is to improve the performance of, including a reduction in thickness of, and/or improve the mass productivity of a liquid crystal display apparatus having a backlight device of a remote phosphor configuration.

Solution to Problem

A liquid crystal display apparatus according to an embodiment of the present invention is a liquid crystal display apparatus including a liquid crystal display panel and a backlight device that emits light toward a back surface of the liquid crystal display panel, wherein: the backlight device includes: an LED substrate having a front surface on which a plurality of LED chips are arranged so as to emit excitation light toward the back surface of the liquid crystal display panel; a phosphor layer including a phosphor that receives the excitation light to emit luminescence; a wavelength-selective reflection layer that is arranged between the phosphor layer and the LED substrate, wherein a transmittance for the excitation light is higher than a transmittance for the luminescence; and an optical layer stack that is arranged closer to the liquid crystal display panel than the phosphor layer; and the optical layer stack, the phosphor layer and the wavelength-selective reflection layer are integrally secured to the back surface of the liquid crystal display panel via a plurality of adhesive layers including a first adhesive layer.

In one embodiment, the first adhesive layer is formed between the optical layer stack and the phosphor layer, and the first adhesive layer includes a plurality of adhesive portions arranged discretely and forms an air layer between the optical layer stack and the phosphor layer.

In one embodiment, an area percentage of the plurality of adhesive portions in the first adhesive layer is 50% or less.

In one embodiment, the optical layer stack includes a light diffusion layer.

In one embodiment, the light diffusion layer is formed closest to the phosphor layer among layers included in the optical layer stack.

In one embodiment, the optical layer stack includes a polarization-selective reflection layer.

In one embodiment, the light diffusion layer is arranged closer to the LED substrate than the polarization-selective reflection layer.

In one embodiment, the optical layer stack includes at least one prism sheet.

In one embodiment, the at least one prism sheet includes two prism sheets arranged so that prism ridgelines thereof extend generally orthogonal to each other.

In one embodiment, the optical layer stack includes two prism sheets arranged so that prism ridgelines thereof extend generally orthogonal to each other, and a polarization-selective reflection layer arranged on the two prism sheets, wherein a surface facing the LED substrate of one prism sheet of the two prism sheets that is closer to the phosphor layer is a mirror surface.

In one embodiment, a surface facing the LED substrate of the optical layer stack is a mirror surface.

In one embodiment, there is no light diffusion layer between the LED substrate and the wavelength-selective reflection layer.

In one embodiment, the plurality of adhesive layers include two or more adhesive layers formed between the optical layer stack and the phosphor layer, and the first adhesive layer of the two or more adhesive layers is arranged closest to the optical layer stack.

In one embodiment, a reflective member that reflects the luminescence and the excitation light is absent in areas of the front surface of the LED substrate between the plurality of LED chips.

In one embodiment, an absorbing member that absorbs the luminescence is provided in areas of the front surface of the LED substrate between the plurality of LED chips.

In one embodiment, the phosphor includes a quantum dot phosphor.

In one embodiment, the plurality of LED chips are bare chips mounted on the LED substrate and are arranged in a matrix pattern with a pitch of 20 mm or less.

In one embodiment, D/P is 0.8 or more, where P is the pitch of the plurality of LED chips and D is the distance between the front surface of the LED substrate and the wavelength-selective reflection layer.

In one embodiment, the distance between the front surface of the LED substrate and the wavelength-selective reflection layer is 5 mm or less.

A manufacturing method according to an embodiment of the present invention is a method for manufacturing any of the liquid crystal display apparatuses set forth above, the method including: a step A of providing the liquid crystal display panel; a step B of, after the step A, integrally securing the optical layer stack, the phosphor layer and the wavelength-selective reflection layer on the back surface of the liquid crystal display panel via the plurality of adhesive layers; step C of providing the LED substrate having the front surface on which the plurality of LED chips are arranged; and a step D of, after the step B and the step C, securing together the liquid crystal display panel and the LED substrate so that the plurality of LED chips face the back surface of the liquid crystal display panel.

In one embodiment, the step B includes: a step B1 of integrally securing together the phosphor layer and the wavelength-selective reflection layer; a step B2 of securing the optical layer stack on the back surface of the liquid crystal display panel; and a step B3 of, after the step B1 and the step B2, bonding the optical layer stack and the phosphor layer to each other.

In one embodiment, the step B includes a step of integrally securing together the optical layer stack, the phosphor layer and the wavelength-selective reflection layer, and then securing the optical layer stack, the phosphor layer and the wavelength-selective reflection layer on the back surface of the liquid crystal display panel.

In one embodiment, the step B includes a step of integrally securing together the phosphor layer and the wavelength-selective reflection layer, and then integrating the phosphor layer and the wavelength-selective reflection layer with the optical layer stack.

In one embodiment, the step B includes a step of integrally securing together the optical layer stack and the phosphor layer, and then integrating the optical layer stack and the phosphor layer with the wavelength-selective reflection layer.

In one embodiment, the step of bonding together the optical layer stack and the phosphor layer is performed by using a double-sided adhesive film that includes a base film and two adhesive layers formed on opposite sides of the base film, wherein one adhesive layer of the two adhesive layers that is closer to the optical layer stack includes a plurality of adhesive portions arranged discretely.

In one embodiment, the step of bonding together the optical layer stack and the phosphor layer includes a step of bringing the optical layer stack and the phosphor layer into contact with opposite sides of an adhesive layer that includes a plurality of adhesive portions arranged discretely.

In one embodiment, the step of bonding together the optical layer stack and the phosphor layer includes a step of applying an adhesive layer on one side of the optical layer stack and then integrating the adhesive layer with the phosphor layer, or a step of applying an adhesive layer on one side of the phosphor layer and then integrating the adhesive layer with the optical layer stack.

Advantageous Effects of Invention

According to an embodiment of the present invention, it is possible to improve the performance of, including a reduction in thickness of, and/or improve the mass productivity of a liquid crystal display apparatus having a backlight device of a remote phosphor configuration.

DESCRIPTION OF EMBODIMENTS

Figure 1:
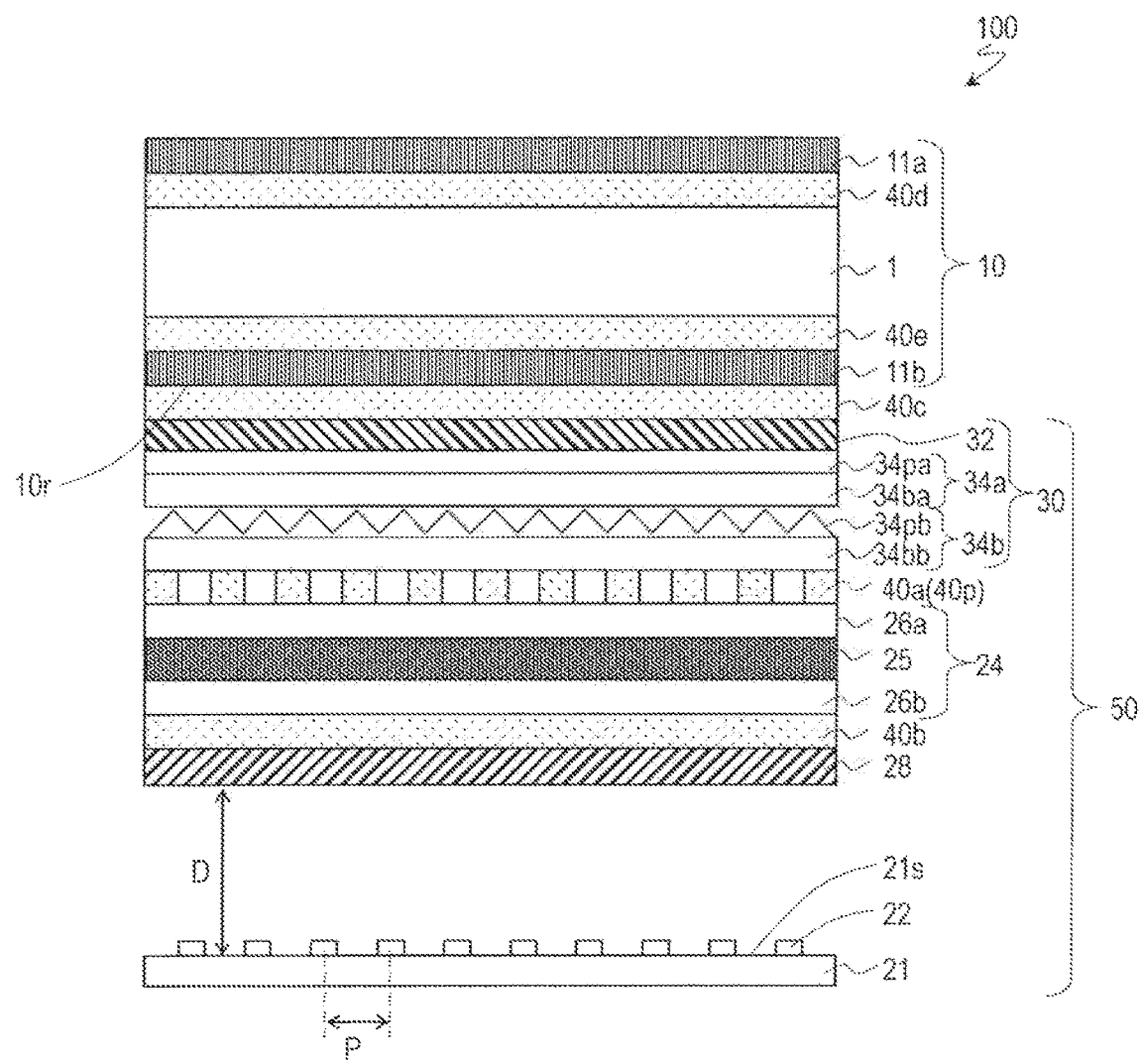
FIG. 1 is a cross-sectional view schematically showing a liquid crystal display apparatus 100 according to an embodiment of the present invention.

First, referring to FIG. 8 and FIG. 9, the structure of a conventional backlight device of a remote phosphor configuration, and room for improvement thereof, will be described. A backlight device 950 of Reference Example 1 illustrated herein has a similar structure to that of the backlight device described in Patent Document No. 1, for example.

FIG. 8(a) is a cross-sectional view schematically showing the backlight device 950, and FIG. 8(b) is a cross-sectional view schematically showing a liquid crystal display apparatus 900 of Reference Example 1 having the backlight device 950.

As shown in FIG. 8(a), the backlight device 950 includes an LED substrate 901, a plurality of light-emitting elements 910 supported by the LED substrate 901, a phosphor sheet 920 arranged apart from the plurality of light-emitting elements 910, and a wavelength-selective reflection film (dichroic filter) 930 arranged between the phosphor sheet 920 and the plurality of light-emitting elements 910. The phosphor sheet 920 is excited by light emitted from the light-emitting elements 910 to emit luminescence. The light-emitting elements 910 are blue LEDs, for example, and the phosphor sheet 920 includes a phosphor that emits green luminescence and a phosphor that emits red luminescence. With the remote phosphor configuration, since the phosphor sheet 920 is arranged apart from the light-emitting elements 910, it is possible to suppress deterioration of the phosphor resulting from the heat generated by the light-emitting elements 910.

The phosphor sheet 920 includes a phosphor layer 921 and protection layers 922 and 923 provided on opposite sides of the phosphor layer 921, for example.

The wavelength-selective reflection film 930 transmits at least a part of the wavelength region of light emitted from the light-emitting elements 910, and reflects at least a part of the light ("luminescence") emitted from the phosphor sheet 920. Preferably, the wavelength-selective reflection film 930 transmits all of the light emitted from the light-emitting elements 910 and reflects all of the light emitted from the phosphor sheet 920. For example, where the light-emitting elements 910 are blue LEDs, the wavelength-selective reflection film 930 transmits light of the emission wavelength region of blue LEDs (i.e., blue light) and reflects light of the wavelength region from green to red. As will be described with reference to FIG. 9, with the provision of the wavelength-selective reflection film 930, the backlight device 950 can suppress color non-uniformity when partial drive is performed. Note that light emitted from the phosphor sheet may be referred to as "luminescence" in the present specification. Unless specified otherwise, "luminescence" includes fluorescence and phosphorescence.

The backlight device 950 further includes a diffusion plate 940 between the plurality of light-emitting elements 910 and the wavelength-selective reflection film 930. The diffusion plate 940 functions to increase the intensity distribution uniformity of light that is emitted from the plurality of light-emitting elements 910 to reach the wavelength-selective reflection film 930. Increasing the ratio (D1/P) of the distance D1 between the LED substrate 901 and the diffusion plate 940 relative to the pitch P of the light-emitting elements 910 will increase the intensity distribution uniformity but will result in a thicker backlight device. Where the diffusion plate 940 is omitted, the distance between the LED substrate 901 and the wavelength-selective reflection film 930 can be increased, which however will further increase the thickness of the backlight device. It is possible to increase the intensity distribution uniformity also by adjusting the distribution of light emitted from the LED chips by using the lens function of a glass, or the like, for encapsulating LED chips. However, this will result in a thicker backlight device and/or make it impossible to increase the array density of LEDs.

Moreover, in the first place, a liquid crystal display apparatus was conventionally produced by providing the backlight device 950 including the phosphor sheet 920, the wavelength-selective reflection film 930, etc., and combining the backlight device 950 and a liquid crystal display panel together, as described in Patent Document No. 1. Therefore, as FIG. 8(*b*) schematically shows a cross-sectional view of the liquid crystal display apparatus 900 of Reference Example 1 having the backlight device 950, a gap G of about 1 mm to 2 mm, for example, was provided between a liquid crystal display panel 990 and the backlight device 950. This is for preventing the optical sheet, of the backlight device 950, arranged to face the liquid crystal display panel 990 and the optical sheet, of the liquid crystal display panel 990, arranged to face the backlight device 950 from being scratched due to friction, etc.

Next, referring to FIG. 9, the functions and advantageous effects of the wavelength-selective reflection film 930 will be described.

Figure 9:
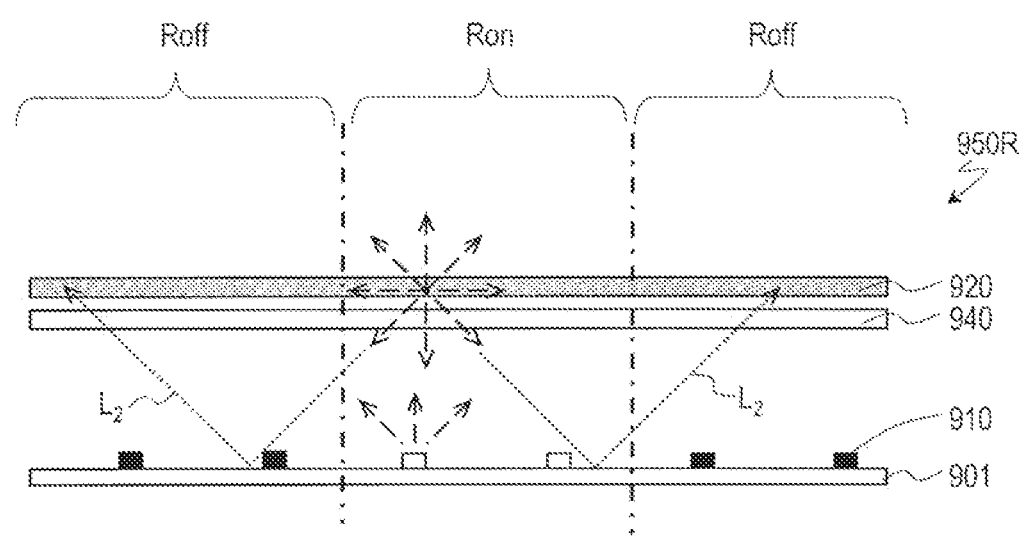
FIG. 9(a) is a schematic diagram showing a configuration where partial drive is performed using a backlight device 950R of Reference Example 2.
FIG. 9(b) is a diagram schematically showing an image pattern displayed on a liquid crystal display apparatus 900R of Reference Example 2 having the backlight device 950R.
Figure 9:
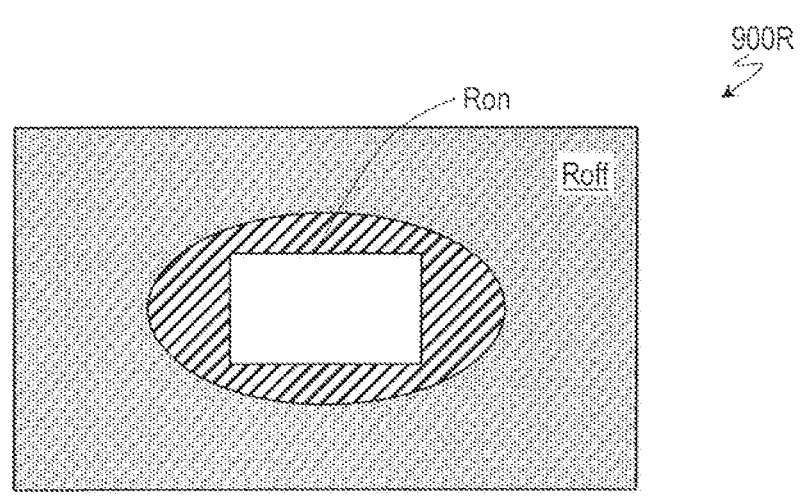

FIG. 9(*a*) is a cross-sectional view schematically showing a backlight device 950R of Reference Example 2. The backlight device 950R is a direct-type backlight device of a remote phosphor configuration that includes no wavelength-selective reflection film. The backlight device 950R is different from the backlight device 950 of Reference Example in that the wavelength-selective reflection film 930 is absent. As shown in FIG. 9(*a*), color non-uniformity may occur if partial drive is performed by using the backlight device 950R. When partial drive is performed, the backlight device 950R includes lit regions Ron where light-emitting elements 910 are lit and non-lit regions Roff where light-emitting elements 910 are not lit. FIG. 9(*b*) schematically shows an image pattern displayed on a liquid crystal display apparatus 900R of Reference Example 2 having the backlight device 950R. FIG. 9(*b*) is a schematic diagram of the liquid crystal display panel of the liquid crystal display apparatus 900R as seen from the direction normal thereto.

As shown in FIG. 9(*b*), the yellowish tinge (referred to also as "coloring") may become strong in a part of the area around a lit region Ron that should be a dark area (the left-down hatching area shown in the figure). One possible cause of this phenomenon is that light L2 that is emitted rearward (toward the LED substrate 901), of the light emitted from the phosphor sheet 920 in a lit region Ron, is reflected by the LED substrate 901 to enter a non-lit region Roff. Light L2 contains more light in the red-to-green wavelength region than blue light.

Note that the front surface (the surface on which the light-emitting elements 910 are provided) of the LED substrate 901 may include a reflective sheet between the light-emitting elements 910 in order to increase the brightness. Without the provision of the reflective sheet, a sufficient brightness may not be obtained. With the provision of the reflective sheet, the occurrence of the color non-uniformity may become more pronounced.

Figure 8:
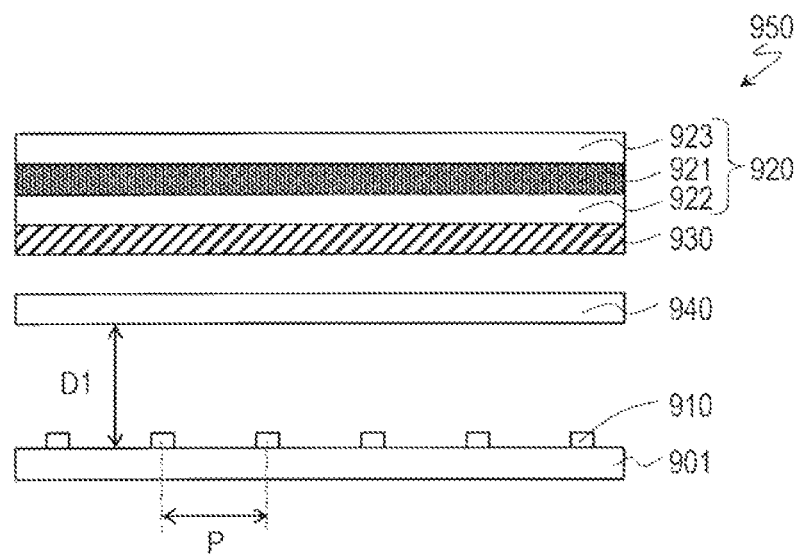
FIG. 8(a) is a cross-sectional view schematically showing a backlight device 950 of Reference Example 1.
FIG. 8(b) is a cross-sectional view schematically showing a liquid crystal display apparatus 900 of Reference Example 1 having the backlight device 950.
Figure 8:
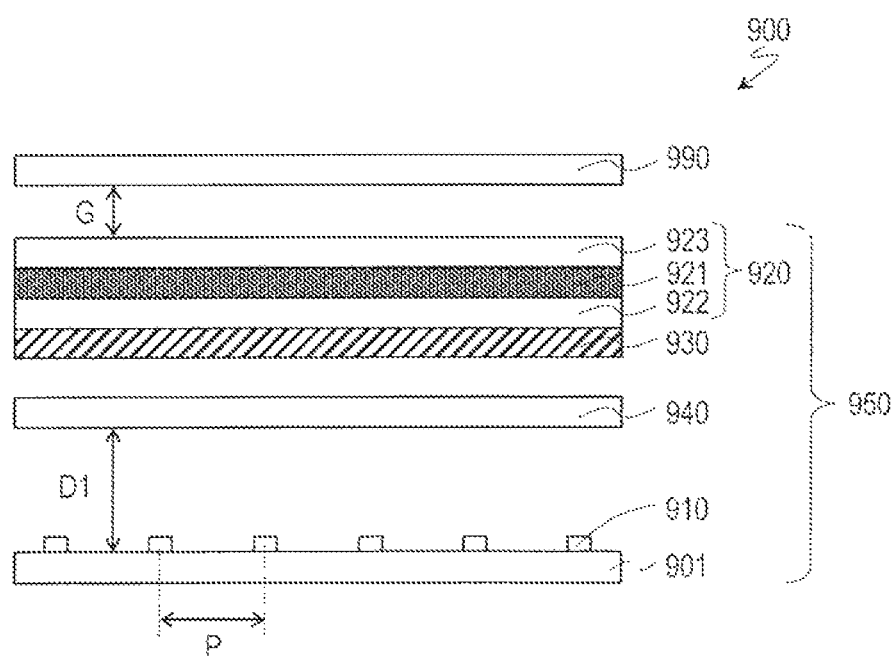

In contrast, since the backlight device 950 of Reference Example 1 shown in FIG. 8(*a*) includes the wavelength-selective reflection film 930, light that is emitted rearward (toward the LED substrate 901) from the phosphor sheet 920 and is reflected by the LED substrate 901 is prevented from entering the phosphor sheet 920 in a non-lit region. Therefore, it is possible to suppress color non-uniformity when partial drive is performed.

As described above, Patent Document No. 1 discloses a direct-type backlight device of a remote phosphor configuration capable of partial drive. However, the problem that there is a limit to reduction in thickness is regardless of whether the driving method is partial drive or not, but is a common problem for liquid crystal display apparatuses having a backlight device of a remote phosphor configuration. The embodiment of the present invention is regardless of whether the driving method is partial drive or not, but is applicable to liquid crystal display apparatuses having a backlight device of a remote phosphor configuration. The backlight device provided in the liquid crystal display apparatus according to an embodiment of the present invention is of a direct type, for example. It may be of an edge-lit type.

A liquid crystal display apparatus according to an embodiment of the present invention and a method for manufacturing the same will now be described. Note that the embodiment of the present invention is not limited to the embodiment illustrated hereinbelow. In the following description, components of the same function will be denoted by the same reference sign, and redundant description may be avoided.

Referring to FIG. 1, a liquid crystal display apparatus 100 according to the embodiment of the present invention will be described. FIG. 1 is a cross-sectional view schematically showing the liquid crystal display apparatus 100 according to the embodiment of the present invention.

As shown in FIG. 1, the liquid crystal display apparatus 100 includes a liquid crystal display panel 10, and a backlight device 50 that emits light toward a back surface 10r of the liquid crystal display panel 10. The backlight device 50 includes an LED substrate 21 having a front surface 21s on which a plurality of LED chips 22 are arranged so as to emit excitation light toward the back surface 10r of the liquid crystal display panel 10, a phosphor layer 25 that includes a phosphor that emits luminescence upon receiving the excitation light, a wavelength-selective reflection layer 28 that is arranged between the phosphor layer 25 and the LED substrate 21, wherein the transmittance for excitation light is higher than the transmittance for luminescence, and an optical layer stack 30 that is arranged closer to the liquid crystal display panel 10 than the phosphor layer 25. The optical layer stack 30, the phosphor layer 25 and the wavelength-selective reflection layer 28 are integrally secured to the back surface 10r of the liquid crystal display panel 10 via a plurality of adhesive layers 40a, 40b and 40c.

In the liquid crystal display apparatus 100, the optical layer stack 30, the phosphor layer 25 and the wavelength-selective reflection layer 28 are integrally secured to the back surface 10r of the liquid crystal display panel 10 via a plurality of adhesive layers 40a, 40b and 40c. In other words, the optical layer stack 30, the phosphor layer and the wavelength-selective reflection layer 28 are supported by the liquid crystal display panel 10. As described above, in the liquid crystal display apparatus 100, no gap is formed between the optical sheet, of the backlight device 50, that is provided to face the liquid crystal display panel 10 and the liquid crystal display panel 10, and it is possible to accordingly reduce the thickness as compared with a conventional liquid crystal display apparatus. Moreover, since the liquid crystal display apparatus 100 does not include a light diffusion layer (e.g., a light diffusion plate) between the LED substrate 21 and the wavelength-selective reflection layer 28, it is possible to further reduce the thickness.

The optical layer stack 30 is provided in order to effectively direct the luminescence emitted from the phosphor layer 25 onto the liquid crystal display panel 10 or to protect the phosphor layer 25. The optical layer stack 30 includes at least one optical layer. The optical layer may be a protection layer or an adhesive layer. The optical layer stack preferably includes a functional optical layer as illustrated blow. Note that the configuration of the optical layer stack is not limited to those illustrated herein.

In this example, the optical layer stack 30 includes two prism sheets 34a and 34b and a polarization-selective reflection layer 32 arranged thereon. The two prism sheets 34a and 34b are arranged so that prism ridgelines thereof extend generally orthogonal to each other. The prism sheets 34a and 34b include, for example, a base film 34ba and 34bb, and a prism layer 34pa and 34pb formed on the base film 34ba and 34bb, respectively. For example, BEF manufactured by 3M may be used as the prism sheet 34a, 34b. For example, the polarization-selective reflection layer 32 is an optical multilayer film having a layered structure including films of different refractive indices that are layered together. For example, DBEF (Registered Trademark) manufactured by 3M may be used as the polarization-selective reflection layer 32. For example, the surface facing the LED substrate 21 of the prism sheet 34b of the two prism sheets 34a and 34b that is closer to the phosphor layer 25 is a mirror surface.

The adhesive layers 40a, 40b and 40c include the first adhesive layer 40a, which is formed between the optical layer stack 30 and the phosphor layer 25. The first adhesive layer 40a includes a plurality of discretely-arranged adhesive portions 40p, and forms an air layer between the optical layer stack 30 and the phosphor layer 25.

As an experiment example will be illustrated later, it was found that the brightness can be improved by the structure of the first adhesive layer 40a provided closer to the liquid crystal display panel 10 than the phosphor layer 25. That is, it was found that the brightness can be improved (e.g., as compared with the liquid crystal display apparatus 100R shown in FIG. 2) by the first adhesive layer 40a having the discretely-arranged adhesive portions 40p and the air layer formed between the optical layer stack 30 and the phosphor layer 25.

The first adhesive layer 40a is included in a double-sided adhesive film that includes a base film (e.g., a PET film) and two adhesive layers formed on opposite sides of the base film, for example. In this case, if the first adhesive layer 40a of the two adhesive layers is arranged to be closest to the optical layer stack 30, it is possible to further improve the brightness as compared with the reverse arrangement. Then, the other adhesive layer of the two adhesive layers may be an adhesive layer that is formed continuously across the entire surface of the base film.

Optional protection layers 26a and 26b may be provided on opposite sides of the phosphor layer 25. The wavelength-selective reflection layer 28 and the phosphor layer 25 (or the protection layer 26b provided closer to the LED substrate 21 than the phosphor layer 25) are bonded to each other via the second adhesive layer 40b, for example.

The liquid crystal display panel 10 includes a liquid crystal cell 1 and polarizing plates 11a and 11b provided on opposite sides of the liquid crystal cell 1. The polarizing plates 11a and 11b are bonded to the liquid crystal cell 1 respectively via adhesive layers 40d and 40e, for example. The liquid crystal display panel of the liquid crystal display apparatus 100 is not limited to the illustrated example, but may be any liquid crystal display panel known in the art.

Figure 2:
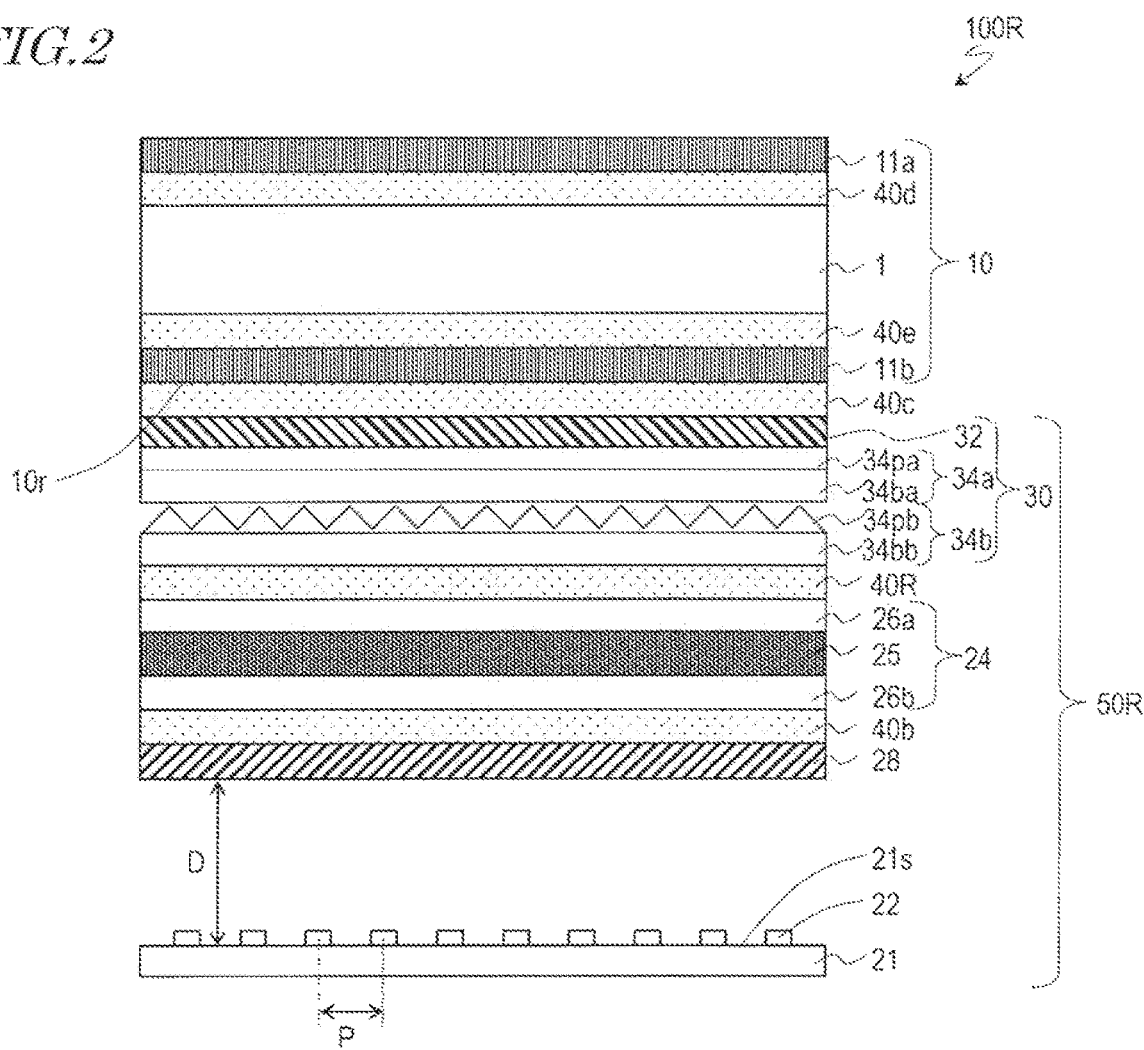
FIG. 2 is a cross-sectional view schematically showing a liquid crystal display apparatus 100R according to another embodiment of the present invention.

FIG. 2 shows another example embodiment of the present invention. FIG. 2 is a cross-sectional view schematically showing the liquid crystal display apparatus 100R.

As shown in FIG. 2, the liquid crystal display apparatus 100R is different from the liquid crystal display apparatus 100 shown in FIG. 1 in that a first adhesive layer 40R is formed so as to coincide with substantially the entire of the phosphor layer 25 as seen from the direction normal to the liquid crystal display panel 10. That is, the first adhesive layer 40R of the liquid crystal display apparatus 100R does not include a plurality of discretely-arranged adhesive portions, and does not form an air layer between the optical layer stack 30 and the phosphor layer 25.

As with the liquid crystal display apparatus 100 shown in FIG. 1, the liquid crystal display apparatus 100R does not form a gap between the optical sheet, of the backlight device 50, that is provided to face the liquid crystal display panel 10 and the liquid crystal display panel 10, and it is therefore possible to make the liquid crystal display apparatus 100R thinner than a conventional liquid crystal display apparatus. Moreover, since the liquid crystal display apparatus 100R does not include a light diffusion layer between the LED substrate 21 and the wavelength-selective reflection layer 28, it is possible to further reduce the thickness of the liquid crystal display apparatus 100R.

With the liquid crystal display apparatus 100 shown in FIG. 1, it is possible to improve the brightness as compared with the liquid crystal display apparatus 100R. This will be discussed with reference to FIG. 3 and FIG. 4. Note that below is a discussion of the present inventors, and does not limit the present invention.

Figure 3:
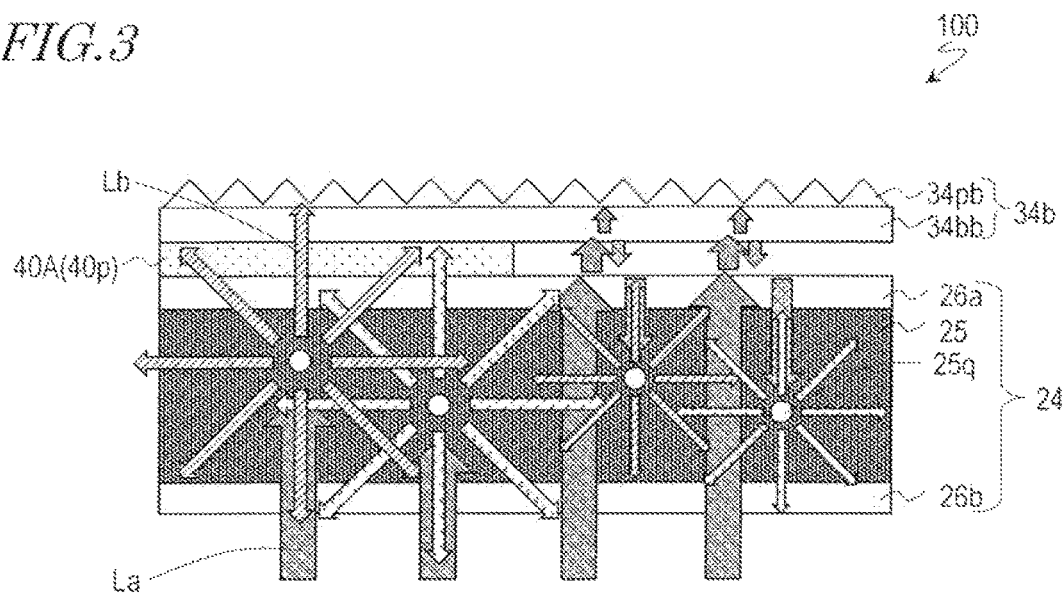
FIG. 3 is a schematic cross-sectional view of the liquid crystal display apparatus 100, showing a part of FIG. 1 on an enlarged scale.
Figure 4:
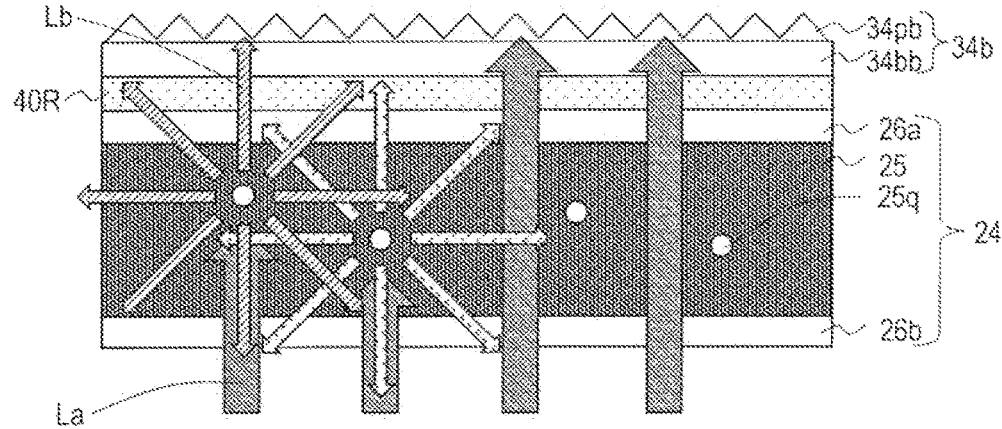
FIG. 4 is a schematic cross-sectional view of the liquid crystal display apparatus 100R, showing a part of FIG. 2 on an enlarged scale.

FIG. 3 and FIG. 4 are schematic cross-sectional views showing the liquid crystal display apparatus 100 and the liquid crystal display apparatus 100R, respectively. FIG. 3 and FIG. 4 schematically show a part of FIG. 1 and FIG. 2, respectively, on an enlarged scale.

As shown in FIG. 3, in the liquid crystal display apparatus 100, excitation light La that is emitted from the LED chips 22 toward the back surface 10r of the liquid crystal display panel 10 enters the phosphor layer 25. The phosphor layer 25 includes the phosphor 25q that receives excitation light La to emit luminescence Lb. Luminescence Lb includes fluorescence and phosphorescence. Herein, the phosphor layer 25 includes a quantum dot phosphor 25q dispersed in a resin. When excitation light La enters the quantum dot phosphor 25q, luminescence Lb is emitted. A part of the excitation light La is emitted toward the liquid crystal display panel 10 passing through the phosphor layer 25. A part of the excitation light La re-enters the phosphor layer 25 by being reflected by the interface between the protection layer 26a and the air layer formed by the first adhesive layer 40a. Thus, it is possible to improve the efficiency of use of the excitation light. The excitation light La is also reflected by the interface between the air layer formed by the first adhesive layer 40a and the prism sheet 34b to re-enter the phosphor layer 25. With the liquid crystal display apparatus 100, since the efficiency of use of the excitation light, it is possible to improve the brightness as compared with the liquid crystal display apparatus 100R.

In contrast, as shown in FIG. 4, in the liquid crystal display apparatus 100R, the reflection of the excitation light La at the interface between the protection layer 26a and the first adhesive layer 40R is suppressed. This is because the difference between the refractive index of the protection layer 26a and the refractive index of the first adhesive layer 40R is smaller than the difference between the refractive index a of the protection layer 26a and the refractive index of the air layer. Similarly, the reflection of the excitation light La is suppressed also at the interface between the first adhesive layer 40R and the prism sheet 34b. This is because the difference between the refractive index of the first adhesive layer 40R and the refractive index of the prism sheet 34b (the refractive index of the base film 34bb of the prism sheet 34b) is smaller than the difference between the refractive index of the air layer and the refractive index of the prism sheet 34b (the refractive index of the base film 34bb of the prism sheet 34b). Therefore, the efficiency of use of the excitation light is lower as compared with the liquid crystal display apparatus 100. In an extreme example, where the protection layer 26a, the first adhesive layer 40R and the base film 34bb of the prism sheet 34b have generally an equal refractive index, the excitation light La emitted from the phosphor layer 25 enters the prism sheet 34b without being reflected by the interface between these layers.

The area percentage of the adhesive portions 40p in the first adhesive layer 40a is preferably small, e.g., 50% or less, in order to improve the efficiency of use of the excitation light. In view of the mechanical strength of the backlight device 50, it is preferably large, e.g., 50% or more. The size of each adhesive portion 40p (which refers to the area circle equivalent diameter, and is the diameter (dot diameter) if the adhesive portions 40p are generally circular) is about 300 μm to 600 μm, for example. If smaller than this, some adhesive portions 40p may possibly come off. Note that it is preferred to adjust the size, the pitch and the direction of arrangement of the adhesive portions 40p so as not to interfere with the periodical structure of the pixel arrangement. The first adhesive layer 40a is formed by using an adhesive (optically clear adhesive) that is optically transparent and does not scatter, for example.

Figure 5:
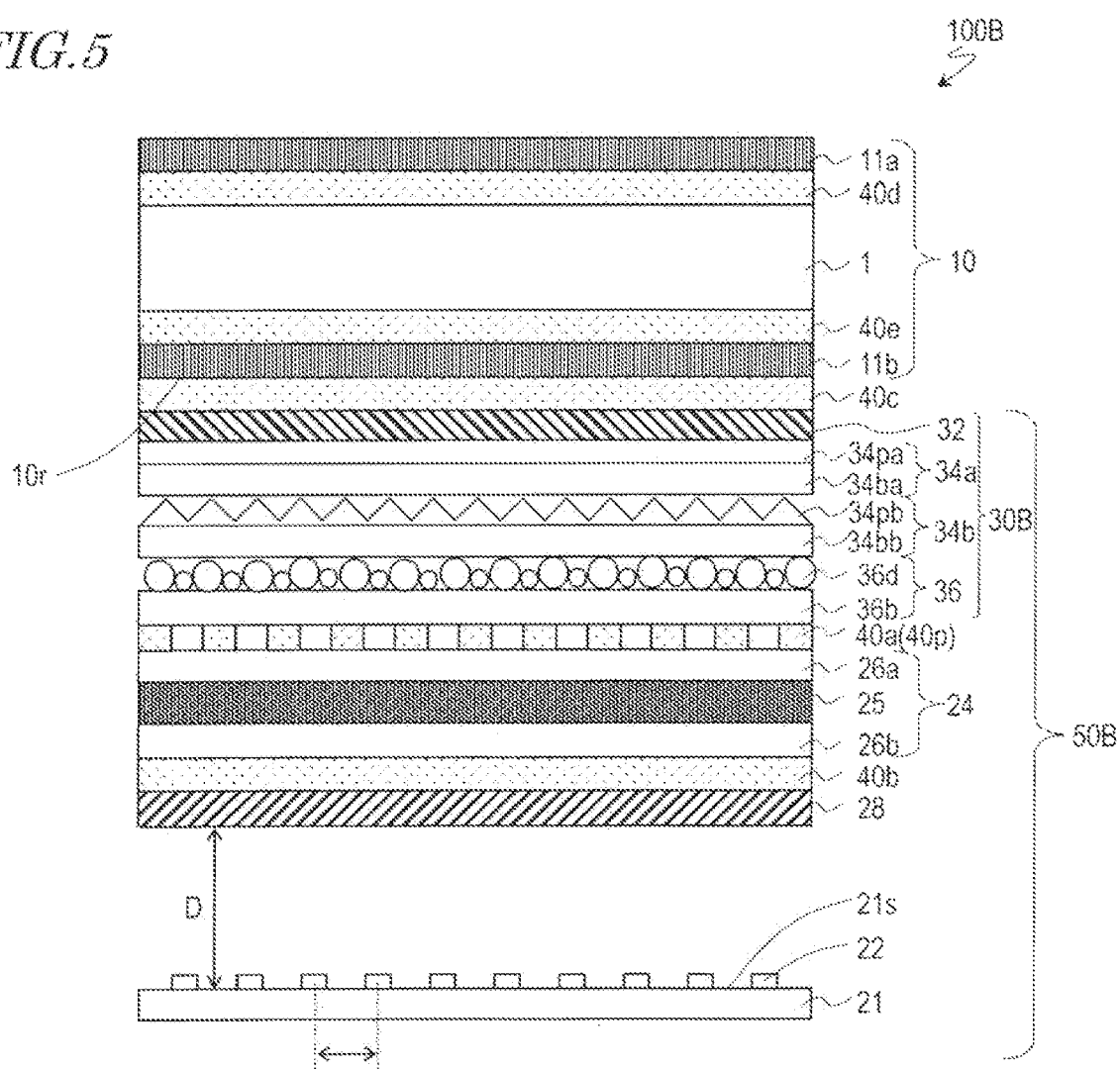
FIG. 5 is a cross-sectional view schematically showing a liquid crystal display apparatus 100B according to still another embodiment of the present invention.

Thus, it is believed that if an air layer is formed between the phosphor layer 25 (or the protection layer 26a provided closer to the liquid crystal display panel 10 than the phosphor layer 25) and the optical layer stack 30, it is possible to improve the efficiency of use of the excitation light, thus improving the brightness of the liquid crystal display apparatus. The structure of the optical layer stack 30 is not limited to those illustrated herein. One of the optical layers of the optical layer stack that is closest to the phosphor layer 25 may be a prism sheet, or may be any layer such as a polarization-selective reflection layer, a polarization layer, a light diffusion layer, a transparent sheet or a protection layer. The efficiency of use of the excitation light can be improved by improving the percentage of the excitation light that is emitted toward the liquid crystal display panel 10 passing through the phosphor layer 25 re-entering the phosphor layer 25. Therefore, with no limitation to the first adhesive layer 40a forming the air layer shown in FIG. 1, a light diffusion layer (see, for example, a light diffusion layer 36 of FIG. 5 to be described below), for example, may be provided closer to the liquid crystal display panel 10 than the phosphor layer 25 (or the protection layer 26a provided closer to the liquid crystal display panel 10 than the phosphor layer 25). The first adhesive layer 40a and a light diffusion layer may be used in combination as shown in FIG. 5, or a light diffusion layer may be provided instead of the first adhesive layer 40a. The light diffusion layer is preferably formed as one of the optical layers of the optical layer stack that is closest to the phosphor layer 25.

Note that while an example where the phosphor layer 25 includes the quantum dot phosphor 25q is described herein, the embodiment of the present invention is not limited thereto. There is no limitation thereto as long as it is possible to obtain an advantageous effect of improving the efficiency of use of the excitation light.

A configuration of the liquid crystal display apparatus 100 (particularly, the structure of the backlight device 50) will now be described in greater detail.

The backlight device 50 is of a remote phosphor configuration, wherein a phosphor (the phosphor layer 25) is arranged apart from light-emitting elements (the LED chips 22). The LED chips 22 and the phosphor layer 25 emit white light toward the back surface 10r of the liquid crystal display panel 10. Light emitted from the LED chips 22 excites the phosphor in the phosphor layer 25, thereby emitting light (fluorescence or phosphorescence). For example, where the LED chips 22 are blue LED chips that emit blue light, the phosphor layer 25 may include a phosphor that emits green luminescence and/or a phosphor that emits red luminescence, or may include a phosphor that emits yellow luminescence. In order to realize a high color rendering property, the phosphor layer 25 preferably includes a phosphor that emits green luminescence and/or a phosphor that emits red luminescence. The phosphor layer 25 may include, for example, a quantum dot phosphor that emits green luminescence and/or a quantum dot phosphor that emits red luminescence. Quantum dot phosphors generally have an advantage that the half-width of the peak wavelength of the emission spectrum is narrow and the color purity is high, and they are said to be promising for meeting UHD Premium standard (color reproduction: 90% or higher of BT2020 standard, HDR10 standard), for example. Alternatively, phosphors known in the art such as a red sulfide phosphor (e.g., a calcium sulfide phosphor) or a green sulfide phosphor (e.g., a thiogallate phosphor) may be used. The thickness of the phosphor layer 25 and the thickness of the protection layer 26a, 26b are each about 100 μm, for example, and the sum of the thicknesses of the phosphor layer 25 and the protection layer 26a, 26b is about 300 μm, for example.

The wavelength-selective reflection layer (dichroic filter) 28 transmits at least a part of the wavelength region of light emitted from the LED chips 22 and reflects at least a part of light (fluorescence or phosphorescence) emitted from the phosphor layer 25. Preferably, the wavelength-selective reflection layer 28 transmits all of the light emitted from the LED chips 22 and reflects all of the light emitted from the phosphor layer 25. For example, where the LED chips 22 are blue LEDs, the wavelength-selective reflection layer 28 transmits light of the emission wavelength region of blue LEDs (i.e., blue light) and reflects light of the wavelength region from green to red. For example, the wavelength-selective reflection layer 28 is an optical multi-layer film having a layered structure including films of different refractive indices that are layered together.

Figure 10:
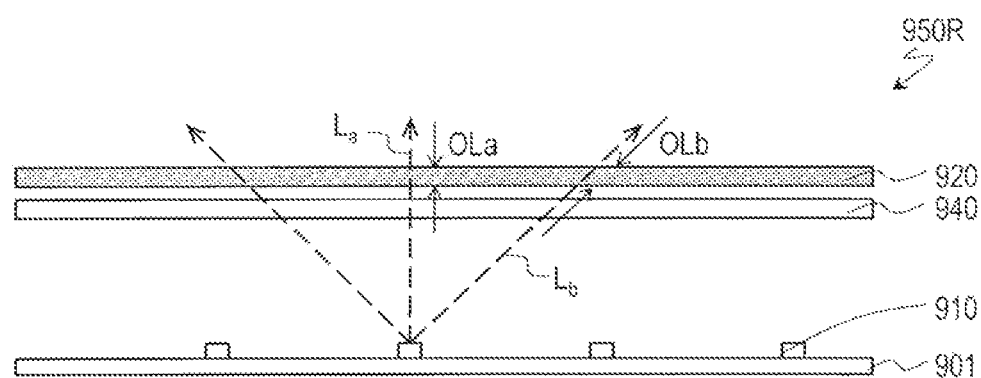
FIG. 10(a) is a schematic diagram showing a configuration where partial drive is not performed using the backlight device 950R.
FIG. 10(b) is a diagram schematically showing an image pattern displayed on the liquid crystal display apparatus 900R.
Figure 10:
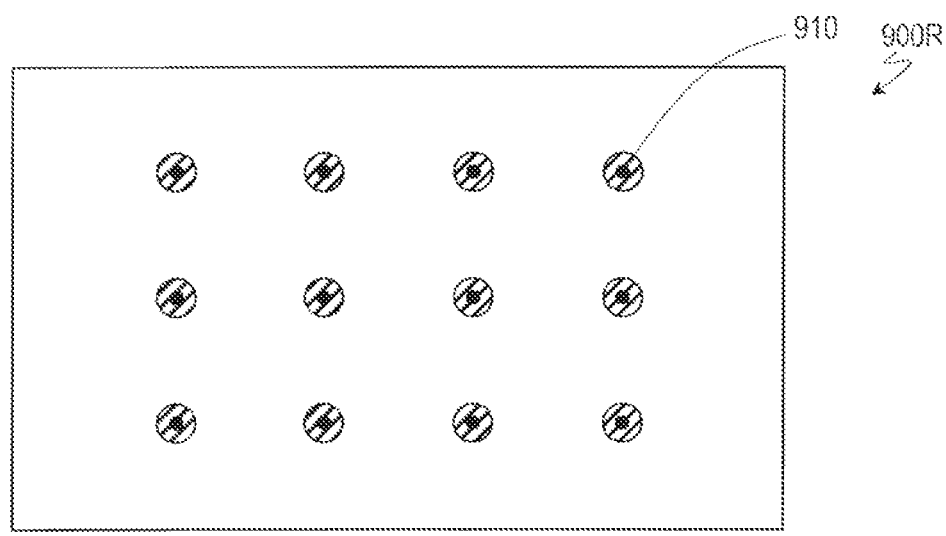

With the provision of the wavelength-selective reflection layer 28, the liquid crystal display apparatus 100 is capable of suppressing color non-uniformity both in the case where partial drive is performed and in the case where it is not performed. The LED chips 22 of the liquid crystal display apparatus 100 may be driven by partial drive or may not be driven by partial drive. If partial drive is performed, it is possible to suppress color non-uniformity occurring in the backlight device 950R of Reference Example 2 described above with reference to FIG. 9, as with the backlight device 950 of Reference Example 1. The case where partial drive is not performed will now be described with reference to FIG. 10.

According to a study by the present inventors, color non-uniformity may occur even when partial drive is not performed with the backlight device 950R of Reference Example 2 as shown in FIG. 10(a). FIG. 10(b) schematically shows an image pattern to be displayed when all-white display is performed with the liquid crystal display apparatus 900R of Reference Example 2. FIG. 10(b) is a schematic diagram of the liquid crystal display panel of the liquid crystal display apparatus 900R as seen from the direction normal thereto.

As shown in FIG. 10(b), even when all-white display is performed (i.e., even when a gray-scale level for displaying white is input to all of the pixels of the liquid crystal display panel), the yellowish tinge may become strong in areas around the light-emitting elements 910 (the left-down hatching areas shown in the figure) as compared with areas that coincide with the light-emitting elements 910. This is because the optical path length $OL_b$ through the phosphor sheet 920 of light Lb that is emitted from a light-emitting element 910 to be incident upon the phosphor sheet 920 at a finite angle of incidence is longer than the optical path length $OL_a$ through the phosphor sheet 920 of light La that is emitted from the light-emitting element 910 to be incident upon the phosphor sheet 920 vertically (with an angle of incidence of 0°), as shown in FIG. 10(a). Thus, as compared with light La, light Lb is more likely to excite the phosphor in the phosphor sheet 920 to emit more light in the wavelength region from red to green. Therefore, the yellowish tinge becomes strong in areas around the light-emitting elements 910 as seen from the direction normal to the liquid crystal display panel.

In contrast, since the liquid crystal display apparatus 100 includes the wavelength-selective reflection layer 28, light that is emitted rearward (toward the LED substrate 21) from the phosphor layer 25 is reflected by the wavelength-selective reflection layer 28 to be emitted toward the back surface 10r of the liquid crystal display panel 10. This increases the intensity of light of the wavelength region from red to green in areas that coincide with the LED chips 22 as seen from the direction normal to the liquid crystal display panel 10. This relaxes the difference in color between areas that coincide with the LED chips 22 and areas therearound, and reduces the color non-uniformity.

Also as the first adhesive layer 40a forms an air layer, the liquid crystal display apparatus 100 provides an advantageous effect of reducing the color non-uniformity in the case where partial drive is not performed. By improving the efficiency of use of the excitation light, the emission intensity of red luminescence and green luminescence increases in areas that coincide with the LED chips 22.

The embodiment of the present invention is not limited to the example described above. For example, the LED chip 22 may emit magenta light. That is, the LED chip 22 may have a structure in which a dispersant (resin) containing a red phosphor dispersed therein is provided on the emission surface of a blue LED chip. In this case, blue light emitted from the blue LED chip excites the red phosphor to emit red light. Blue light and red light are emitted from the LED chips 22 as a whole, which looks like magenta light being emitted. In such a case, the phosphor layer 25 may include a green phosphor, and the wavelength-selective reflection layer 28 may be a layer that transmits blue light and red light and reflects green light.

The LED chips 22 are arranged in a matrix pattern on a front surface 21s of the LED substrate 21, for example. A chassis, for example, may serve also as the LED substrate 21, or the liquid crystal display apparatus 100 may further include a chassis (not shown). The LED chips 22 may be bare chips mounted on the LED substrate 21. That is, the LED chips 22 do not need to be each covered by an optical lens. When the LED chips 22 are bare chips mounted on the LED substrate 21, the following advantages are realized.

As the present inventors studied the configuration of the backlight device 950 of Reference Example 1, it was found that brightness non-uniformity may occur on the liquid crystal display apparatus 900 of Reference Example 1 including the backlight device 950. Brightness non-uniformity occurs when the ratio (D1/P) of the distance D1 between the LED substrate 901 and the diffusion plate 940 relative to the pitch P of the light-emitting elements 910 is smaller than a predetermined value. In order to suppress occurrence of brightness non-uniformity, D1/P is preferably 0.25 or more, for example.

Generally, the light-emitting elements (e.g., LED chips) 910 are each often covered by an optical lens in order to realize an intended light distribution characteristic. The minimum diameter of the optical lens is about 10 mm due to design limitations. Therefore, for example, when the pitch of the light-emitting elements 910 covered by optical lenses is set to be twice the lens diameter of the optical lenses, the pitch P of the light-emitting elements 910 is about 20 mm at minimum. Then, in order to set D1/P to be 0.25 or more, the distance D1 between the LED substrate 901 and the diffusion plate 940 cannot be less than 5 mm. Since the thickness of the diffusion plate 940 is typically some mm, there is a limit to reduction in thickness of the backlight device 950. The front surface (the surface having the light-emitting elements 910 thereon) of the LED substrate 901 may include a reflective sheet between the light-emitting elements 910 in order to increase the brightness. In order to ensure a sufficient area for the provision of the reflective sheet, it may be preferred to increase the pitch of the light-emitting elements 910. Moreover, Patent Document No. 1 states that the distance between the phosphor sheet 920 and the light-emitting elements 910 is preferably 10 mm or more in order to suppress brightness non-uniformity and to suppress influence of heat on the phosphor sheet 920.

In contrast, when the LED chips 22 of the liquid crystal display apparatus 100 are bare chips mounted on the LED substrate 21 (i.e., when a plurality of bare LED chips 22 are arranged on the front surface 21s of the LED substrate 21), the pitch P of the LED chips 22 can be made 20 mm or less. Then, the distance D between the LED substrate 21 and the wavelength-selective reflection layer 28 can be made 5 mm or less while suppressing occurrence of brightness non-uniformity. The liquid crystal display apparatus 100 can be made thinner as compared with the liquid crystal display apparatus 900 of Reference Example 1 while suppressing occurrence of brightness non-uniformity.

Moreover, it was found that when the pitch P of the LED chips 22 is set as small as 20 mm or less in the liquid crystal display apparatus 100, it is possible to sufficiently suppress brightness non-uniformity and color non-uniformity by setting the ratio (D/P) of the distance D between the LED substrate 21 and the wavelength-selective reflection layer 28 relative to the pitch P of the LED chips 22 to be 0.8 or more. That is, it was found that it is possible, with the liquid crystal display apparatus 100, to sufficiently suppress brightness non-uniformity and color non-uniformity without any of the provision of the light diffusion layer between the LED substrate 21 and the wavelength-selective reflection layer 28, the reflective member on the front surface 21s of the LED substrate 21, and the optical lenses covering the LED chips 22.

A reflective member that reflects luminescence and excitation light may be absent between the LED chips 22 on the front surface 21s of the LED substrate 21. Herein, "reflective member" refers to a member having a total light reflectance (the sum of the specular reflectance and the diffuse reflectance) of 80% or more in a hemispherical region of a light-receiving angle $2n$ steradian within the incidence angle range of 0° to 45°. Such a total light reflectance can be measured by using the IS-SA scattering and appearance measurement system manufactured by RADIANT, for example. Since the backlight device 50 has the wavelength-selective reflection layer 28, the absence of a reflective member has a small influence on the decrease of brightness. An absorbing member that absorbs luminescence may be provided between the LED chips 22 on the front surface 21s of the LED substrate 21. The provision of an absorbing member makes it easier to suppress color non-uniformity when partial drive is performed with the backlight device 950R of Reference Example 2 described above with reference to FIG. 9. This is because the amount of light that is emitted rearward (toward the LED substrate 21) from the phosphor layer 25 and reflected by the front surface 21s of the LED substrate 21 to re-enter the phosphor layer 25 decreases, thereby reducing the influence thereof.

FIG. 5 shows still another example embodiment of the present invention. FIG. 5 is a cross-sectional view schematically showing a liquid crystal display apparatus 100B including an optical layer stack 30B.

As shown in FIG. 5, the liquid crystal display apparatus 100B is different from the liquid crystal display apparatus 100 in that the liquid crystal display apparatus 100B includes the optical layer stack 30B. The optical layer stack 30B is different from the optical layer stack 30 in that the optical layer stack 30B further includes the light diffusion layer 36. The light diffusion layer 36 is arranged closer to the LED substrate 21 than the polarization-selective reflection layer 32. For example, the light diffusion layer 36 includes a base film (e.g., PET film) 36b, and a light diffusion material (e.g., spherical beads) 36d provided on the base film 36b.

Also in the optical layer stack 30B, the surface facing the LED substrate 21 of the prism sheet 34b of the two prism sheets 34a and 34b that is closer to the phosphor layer 25 is a mirror surface.

As with the liquid crystal display apparatus 100 shown in FIG. 1, the liquid crystal display apparatus 100B does not form a gap between the optical sheet, of the backlight device 50, that is provided to face the liquid crystal display panel 10 and the liquid crystal display panel 10, and it is therefore possible to make the liquid crystal display apparatus 100B thinner than a conventional liquid crystal display apparatus. Moreover, since the liquid crystal display apparatus 100B does not include a light diffusion layer between the LED substrate 21 and the wavelength-selective reflection layer 28, it is possible to further reduce the thickness of the liquid crystal display apparatus 100B.

Figure 6:
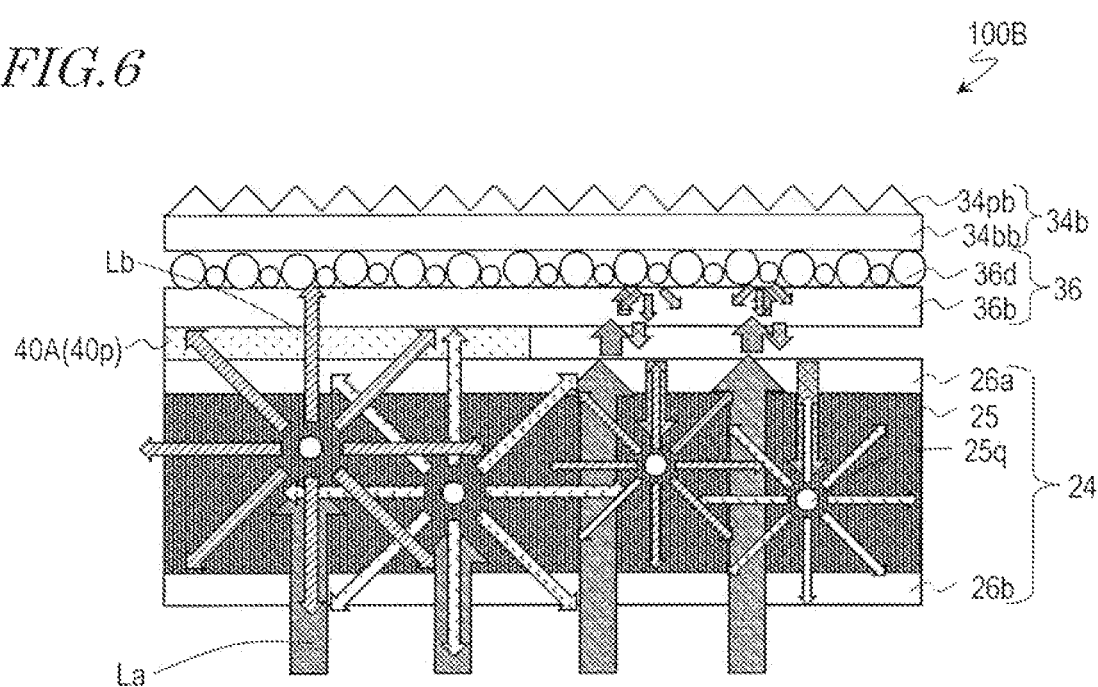
FIG. 6 is a schematic cross-sectional view of the liquid crystal display apparatus 100B, showing a part of FIG. 5 on an enlarged scale.

Also with the liquid crystal display apparatus 100B, as with the liquid crystal display apparatus 100 described above with reference to FIG. 3, it is possible to improve the brightness as compared with the liquid crystal display apparatus 100R. This will be described with reference to FIG. 6. FIG. 6 is a schematic cross-sectional view of the liquid crystal display apparatus 100B, showing a part of FIG. 5 on an enlarged scale.

As shown in FIG. 6, a part of excitation light La, when emitted from the phosphor layer 25 toward the liquid crystal display panel 10, is reflected by the interface between the protection layer 26a and the air layer formed by the first adhesive layer 40a to re-enter the phosphor layer 25. Moreover, it is also reflected by the interface between the air layer formed by the first adhesive layer 40a and the base film 36b of the light diffusion layer 36. If the difference between the refractive index of the light diffusion material 36d and the refractive index of the base film 36b is large, the light may be also reflected by the surface of the light diffusion material 36d. Also by the diffuse reflection by the light diffusion layer 36, the advantageous effect that the excitation light re-enters the phosphor layer 25 can be more pronounced. Thus, the advantageous effect of improving the efficiency of use of the excitation light and the advantageous effect of reducing the color non-uniformity when partial drive is not performed are pronounced.

The method for manufacturing the liquid crystal display apparatus 100 will be described by way of example.

The method for manufacturing the liquid crystal display apparatus 100 includes the following steps, for example.

Step I: providing the liquid crystal display panel 10.

Step II: after Step I, integrally securing the optical layer stack 30, the phosphor layer 25 and the wavelength-selective reflection layer 28 on the back surface 10r of the liquid crystal display panel 10 via the plurality of adhesive layers 40a, 40b and 40c.

Step III: providing the LED substrate 21 having the front surface 21s on which the plurality of LED chips 22 are arranged.

Step IV: after Step II and Step III, securing together the liquid crystal display panel 10 and the LED substrate 21 so that the plurality of LED chips 22 face the back surface 10r of the liquid crystal display panel 10.

Step II includes the following steps, for example.

Step IIa: integrally securing together the phosphor layer 25 and the wavelength-selective reflection layer 28.

Step IIb: securing the optical layer stack 30 on the back surface 10r of the liquid crystal display panel 10.

Step IIc: after Step IIa and Step IIb, bonding the optical layer stack 30 and the phosphor layer 25 to each other.

In this case, it is possible in some cases to suppress the manufacturing cost of the liquid crystal display apparatus 100. In a factory that manufactures the liquid crystal display apparatus 100 including the phosphor layer 25 and a liquid crystal display apparatus including no phosphor layer, if the manufacturing process described above is adopted, it is possible to efficiently manage the manufacture because Step IIc needs to be performed only when manufacturing the liquid crystal display apparatus 100.

Alternatively, Step II may include a step of integrally securing together the optical layer stack 30, the phosphor layer 25 and the wavelength-selective reflection layer 28, and then securing these members on the back surface 10r of the liquid crystal display panel 10. In this case, the phosphor layer 25 and the wavelength-selective reflection layer 28 may be integrally secured together and then integrated with the optical layer stack 30, or the optical layer stack 30 and the phosphor layer 25 may be integrally secured together and then integrated with the wavelength-selective reflection layer 28.

In Step II, the step of bonding together the optical layer stack 30 and the phosphor layer 25 is performed by using a double-sided adhesive film that includes a base film and two adhesive layers formed on opposite sides of the base film. The assembly step can be simplified by using a so-called "double-sided adhesive film" with adhesive layers provided on opposite sides of a base film. One of the two adhesive layers formed on opposite sides of the base film is the first adhesive layer (dot adhesive layer) 40a, and the other is an adhesive layer that is formed continuously across the entire surface the base film. When one of the two adhesive layers that is closer to the optical layer stack 30 is the first adhesive layer 40a, i.e., an adhesive layer that includes a plurality of discretely-arranged adhesive portions 40p, it is possible to increase the efficiency of use of light more (e.g., than with the reverse arrangement).

Alternatively, the step of bonding together the optical layer stack 30 and the phosphor layer 25 may be performed without using a double-sided adhesive film. For example, the step of bonding together the optical layer stack 30 and the phosphor layer 25 may include a step of bringing the optical layer stack 30 and the phosphor layer 25 into contact with the opposite sides of the first adhesive layer 40a, i.e., an adhesive layer that includes the discretely-arranged adhesive portions 40p.

In the step of bonding together the optical layer stack 30 and the phosphor layer 25, an adhesive layer may be applied on one side of the optical layer stack 30 and then integrated with the phosphor layer 25, or an adhesive layer may be applied on one side of the phosphor layer 25 and then integrated with the optical layer stack 30.

The present inventors produced liquid crystal display apparatuses of Examples 1 to 4 and Reference Example as follows, and measured the brightness and chromaticity when the highest gray-scale level is exhibited using a spectroradiometer (spectroradiometer SR-LEDW manufactured by Topcon Technohouse Corporation). Example 1 has the same structure as the liquid crystal display apparatus 100 shown in FIG. 1, Examples 2 and 3 have the same structure as the liquid crystal display apparatus 100B shown in FIG. 5, and Example 4 has the same structure as the liquid crystal display apparatus 100R shown in FIG. 3. Examples 2 and 3 are different from each other in terms of the pitch and the size of the adhesive portions 40p of the first adhesive layer 40a. Example 4 is different from Example 1 in that it includes the first adhesive layer 40R that does not form the air layer.

Figure 11:
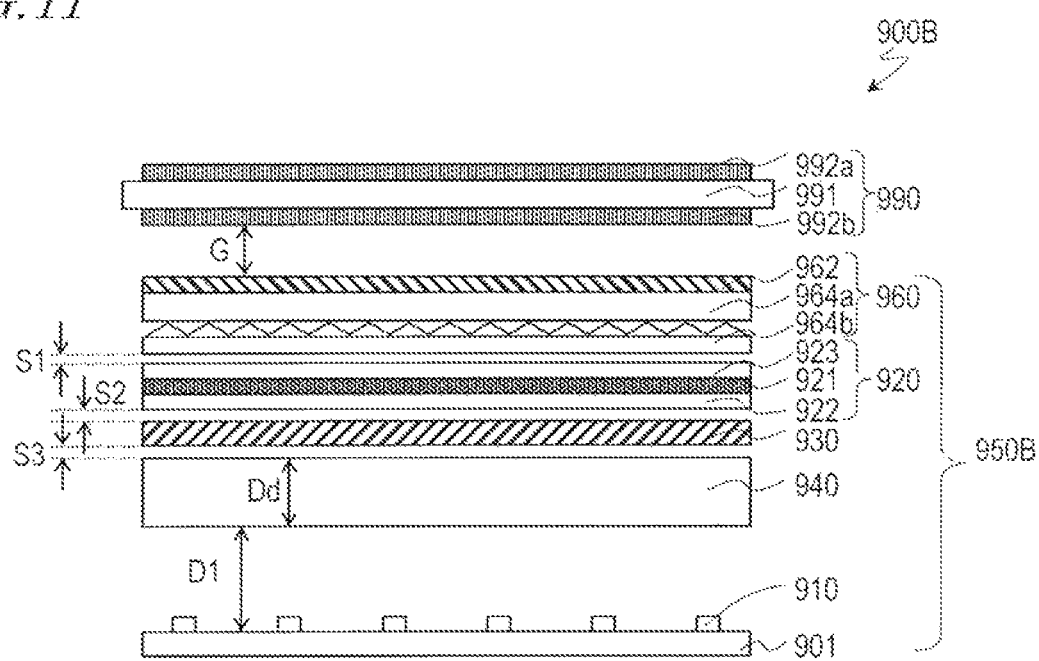
FIG. 11 is a cross-sectional view schematically showing a liquid crystal display apparatus 900B of another reference example.

Reference Example has the same structure as the liquid crystal display apparatus 900B shown in FIG. 11. A backlight device 950B of the liquid crystal display apparatus 900B (Reference Example) is different from the backlight device 950 of the liquid crystal display apparatus 900 shown in FIG. 8(b) in that it includes an optical layer stack 960. The optical layer stack 960 has a similar structure to the optical layer stack 30 of the liquid crystal display apparatus 100 shown in FIG. 1, and includes two prism sheets 964a and 964b and a polarization-selective reflection layer 962 arranged Thereon. No adhesive layer is arranged and air layers S1, S2 and S3 are formed respectively between the optical layer stack 960 and the phosphor sheet 920, between the phosphor sheet 920 and the wavelength-selective reflection film 930 and between the wavelength-selective reflection film 930 and the diffusion plate 940. That is, the wavelength-selective reflection film 930, the phosphor sheet 920 and the optical layer stack 960 are stacked in this order on the diffusion plate 940. Note that the liquid crystal display panel 990 includes a liquid crystal cell 991 and polarizing plates 992a and 992b provided on opposite sides of the liquid crystal cell 991.

Example 1 (in the Following Order from Front Side of Liquid Crystal Display Panel 10)

Polarizing plate 11a (with protection laminate, thickness: 230 μm)

Liquid crystal cell 1 (thickness: 1200 μm, transmittance of glass substrate: 1.49)

Polarizing plate 11b (without protection laminate, thickness: 166 μm)

Optical layer stack 30: GD221 from GLOTEC (DPOP: Optical Composite Function Sheet)

Thickness of optical layer stack 30: 380 μm First adhesive layer 40a: TN20AIR from DIC Pitch of adhesive portions 40p: 800 μm, dot diameter of adhesive portion 40p: 300 μm Area percentage of adhesive portions 40p of first adhesive layer 40a: 50°

Refractive index of first adhesive layer 40a: about 1.49

Thickness of first adhesive layer 40a: 25 μm

Phosphor layer 25 and protection layer 26a, 26b: quantum dot film from Hitachi Chemical Sum of thicknesses of phosphor layer 25 and protection layer 26a, 26b: 360 μm Adhesive layer 40b (thickness: 25 μm)

Wavelength-selective reflection layer 28: Picasus sheet from Toray

Thickness of wavelength-selective reflection layer 28: 70 μm

Protection layer (thickness: 60 μm)

Example 2 (Same as Example 1 Except for Below)

Optical layer stack 30B: (in the following order from liquid crystal display panel 10 side)
  Diffusing adhesive layer (PSA (pressure-sensitive adhesive)) (thickness: 50 μm)
  DBEF-QV2 (core) (thickness: 92 μm) PET film: thickness: 50 μm, refractive index: 1.58
  Prism layer 34pa of the prism sheet 34a: +45° 60P, acrylic resin, thickness: 35 μm, refractive index: 1.56
  Base film 34ba of prism sheet 34a: PET film, thickness: 50 μm, refractive index: 1.58
  Prism layer 34pb of prism sheet 34b: −45° 60P, acrylic resin, thickness: 35 μm, refractive index: 1.56
  Base film 34bb of prism sheet 34b: PET film, thickness: 50 μm, refractive index: 1.58
  Light diffusion material (beads) 36d of light diffusion layer 36: thickness: 30 μm, refractive index: about 1.43 to 1.66
  Base film 36b of light diffusion layer 36: PET film, thickness: 50 μm, refractive index: 1.58
  Matte Coating: Haze: 75%, thickness: 10 μm
  Protection layer: thickness: 40 μm Example 3 (Same as Example 2 Except for Below)

First adhesive layer 40a: TN06AIR from DIC

Pitch of adhesive portions 40p: 580 μm, dot diameter of adhesive portion 40p: 220 μm Area percentage of adhesive portions 40p in first adhesive layer 40a: 50%

Figure 7:
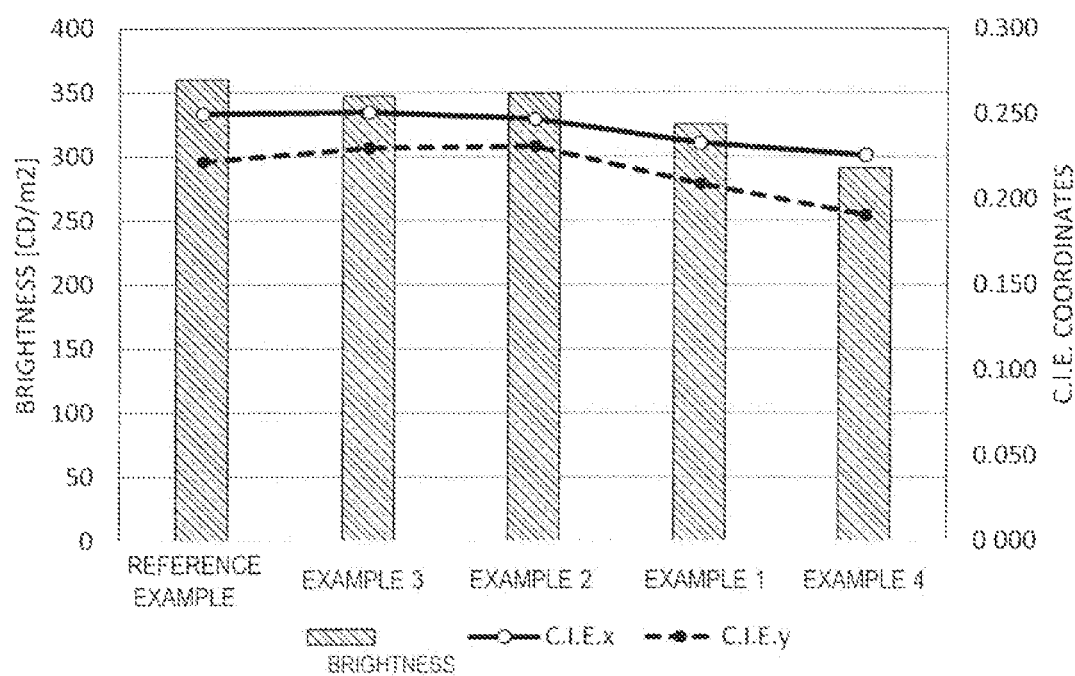
FIG. 7 is a graph showing the evaluation result of an experiment example.

Table 1 and FIG. 7 show evaluation results of Examples 1 to 4 and Reference Example.

TABLE 1

|  | Reference | Example 3 | Example 2 | Example 1 | Example 4 |
|---|---|---|---|---|---|
| Brightness (CD/m$^2$) | 360 | 347 | 349 | 325 | 291 |
| C.T.E.x | 0.250 | 0.251 | 0.247 | 0.233 | 0.226 |
| C.T.E.y | 0.222 | 0.230 | 0.231 | 0.209 | 0.191 |

In Reference Example, a gap G of about 3 mm is provided between the liquid crystal display panel 990 and the backlight device 950B. In contrast, in any of Examples 1 to 4, the liquid crystal display panel and the backlight device (optical layer stack) are bonded together by an adhesive layer, and there is no gap between the liquid crystal display panel and the backlight device. Moreover, the backlight device 950B of Reference Example includes the diffusion plate 940 (thickness Dd: 2 mm), whereas in any of Examples 1 to 4, there is no diffusion plate between the LED substrate and the wavelength-selective reflection layer. Therefore, Examples 1 to 4 could be made thinner than Reference Example by at least about 5 mm.

Moreover, as shown in Table 1 and FIG. 7, any of Examples 1 to 3 including the first adhesive layer 40a that forms the air layer exhibited a higher brightness than Example 4 including the first adhesive layer 40R that does not form the air layer.

INDUSTRIAL APPLICABILITY

The embodiment of the present invention can be used suitably as a liquid crystal display apparatus including an LED backlight.

REFERENCE SIGNS LIST

1 Liquid crystal cell
10 Liquid crystal display panel
10r Back surface
21 LED substrate
21s Front surface
22 LED chip
25 Phosphor layer
25q Quantum dot phosphor
26a, 26b Protection layer
28 Wavelength-selective reflection layer
30, 30B Optical layer stack
32 Polarization-selective reflection layer
34a, 34b Prism sheet
34ba, 34bb Base film
34pa, 34pb Prism layer
36 Light diffusion layer
36b Base film
36d Light diffusion material
40a First adhesive layer
40p Adhesive portion
40b, 40c, 40d, 40e Adhesive layer
50 Backlight device
100, 100B Liquid crystal display apparatus

The invention claimed is:

1. A liquid crystal display apparatus comprising a liquid crystal display panel and a backlight device that emits light toward a back surface of the liquid crystal display panel, wherein:
  the liquid crystal display panel includes a liquid crystal cell and two polarizing plates provided on opposite sides of the liquid crystal cell;
  the backlight device includes:
    an LED substrate having a front surface on which a plurality of LED chips are arranged so as to emit excitation light toward the back surface of the liquid crystal display panel;
    a phosphor layer including a phosphor that receives the excitation light to emit luminescence;
    a wavelength-selective reflection layer that is arranged between the phosphor layer and the LED substrate, wherein a transmittance for the excitation light is higher than a transmittance for the luminescence; and
    an optical layer stack that is arranged closer to the liquid crystal display panel than the phosphor layer;
  the optical layer stack, the phosphor layer and the wavelength-selective reflection layer are integrally secured to the back surface of the liquid crystal display panel via a plurality of adhesive layers including a first adhesive layer, the first adhesive layer being formed between the optical layer stack and the phosphor layer;
  the plurality of adhesive layers further includes a second adhesive layer formed between the optical layer stack and one of the two polarizing plates that is closer to the back surface of the liquid crystal display panel;

the optical layer stack includes a light diffusion layer; and
the light diffusion layer is formed closest to the phosphor layer among layers included in the optical layer stack.

2. The liquid crystal display apparatus of claim 1, wherein the first adhesive layer includes a plurality of adhesive portions arranged discretely and forms an air layer between the optical layer stack and the phosphor layer.

3. The liquid crystal display apparatus of claim 2, wherein an area percentage of the plurality of adhesive portions in the first adhesive layer is 50% or less.

4. The liquid crystal display apparatus of claim 1, wherein
the optical layer stack includes a polarization-selective reflection layer, and
the light diffusion layer is arranged closer to the LED substrate than the polarization-selective reflection layer.

5. The liquid crystal display apparatus of claim 1, wherein the optical layer stack includes at least one prism sheet, and
the at least one prism sheet includes two prism sheets arranged so that prism ridgelines thereof extend generally orthogonal to each other.

6. The liquid crystal display apparatus of claim 1, wherein the optical layer stack includes two prism sheets arranged so that prism ridgelines thereof extend generally orthogonal to each other, and a polarization-selective reflection layer arranged on the two prism sheets, wherein a surface facing the LED substrate of one prism sheet of the two prism sheets that is closer to the phosphor layer is a flat surface.

7. The liquid crystal display apparatus of claim 1, wherein a surface facing the LED substrate of the optical layer stack is a flat surface.

8. The liquid crystal display apparatus of claim 1, wherein there is no light diffusion layer between the LED substrate and the wavelength-selective reflection layer.

9. The liquid crystal display apparatus of claim 1, wherein the plurality of adhesive layers include two or more adhesive layers formed between the optical layer stack and the phosphor layer, and the first adhesive layer of the two or more adhesive layers is arranged closest to the optical layer stack.

10. The liquid crystal display apparatus of claim 1, wherein a reflective member that reflects the luminescence and the excitation light is absent in areas of the front surface of the LED substrate between the plurality of LED chips.

11. The liquid crystal display apparatus of claim 1, wherein an absorbing member that absorbs the luminescence is provided in areas of the front surface of the LED substrate between the plurality of LED chips.

12. The liquid crystal display apparatus of claim 1, wherein the phosphor includes a quantum dot phosphor.

13. A method for manufacturing a liquid crystal display apparatus of claim 1, the method comprising:
a step A of providing the liquid crystal display panel;
a step B of, after the step A, integrally securing the optical layer stack, the phosphor layer and the wavelength-selective reflection layer on the back surface of the liquid crystal display panel via the plurality of adhesive layers;
a step C of providing the LED substrate having the front surface on which the plurality of LED chips are arranged; and
a step D of, after the step B and the step C, securing together the liquid crystal display panel and the LED substrate so that the plurality of LED chips face the back surface of the liquid crystal display panel, wherein the step B includes:
a step B1 of integrally securing together the phosphor layer and the wavelength-selective reflection layer;
a step B2 of securing the optical layer stack on the back surface of the liquid crystal display panel; and
a step B3 of, after the step B1 and the step B2, bonding the optical layer stack and the phosphor layer to each other.

14. A method for manufacturing a liquid crystal display apparatus of claim 1, the method comprising:
a step A of providing the liquid crystal display panel;
a step B of, after the step A, integrally securing the optical layer stack, the phosphor layer and the wavelength-selective reflection layer on the back surface of the liquid crystal display panel via the plurality of adhesive layers;
a step C of providing the LED substrate having the front surface on which the plurality of LED chips are arranged; and
a step D of, after the step B and the step C, securing together the liquid crystal display panel and the LED substrate so that the plurality of LED chips face the back surface of the liquid crystal display panel, wherein
the step B includes a step of integrally securing together the optical layer stack, the phosphor layer and the wavelength-selective reflection layer, and then securing the optical layer stack, the phosphor layer and the wavelength-selective reflection layer on the back surface of the liquid crystal display panel.

15. The manufacturing method of claim 14, wherein the step B includes a step of integrally securing together the phosphor layer and the wavelength-selective reflection layer, and then integrating the phosphor layer and the wavelength-selective reflection layer with the optical layer stack.

16. The manufacturing method of claim 14, wherein the step B includes a step of integrally securing together the optical layer stack and the phosphor layer, and then integrating the optical layer stack and the phosphor layer with the wavelength-selective reflection layer.

17. The manufacturing method of claim 13, wherein the step of bonding together the optical layer stack and the phosphor layer is performed by using a double-sided adhesive film that includes a base film and two adhesive layers formed on opposite sides of the base film, wherein one adhesive layer of the two adhesive layers that is closer to the optical layer stack includes a plurality of adhesive portions arranged discretely.

18. The manufacturing method of claim 13, wherein the step of bonding together the optical layer stack and the phosphor layer includes a step of bringing the optical layer stack and the phosphor layer into contact with opposite sides of an adhesive layer that includes a plurality of adhesive portions arranged discretely.

19. The manufacturing method of claim 13, wherein the step of bonding together the optical layer stack and the phosphor layer includes a step of applying an adhesive layer on one side of the optical layer stack and then integrating the adhesive layer with the phosphor layer, or a step of applying an adhesive layer on one side of the phosphor layer and then integrating the adhesive layer with the optical layer stack.

20. The liquid crystal display apparatus of claim 1, wherein the light diffusion layer includes a base film and a light diffusion material provided on the base film.

21. A liquid crystal display apparatus comprising a liquid crystal display panel and a backlight device that emits light toward a back surface of the liquid crystal display panel, wherein:

the backlight device includes:
- an LED substrate having a front surface on which a plurality of LED chips are arranged so as to emit excitation light toward the back surface of the liquid crystal display panel;
- a phosphor layer including a phosphor that receives the excitation light to emit luminescence;
- a wavelength-selective reflection layer that is arranged between the phosphor layer and the LED substrate, wherein a transmittance for the excitation light is higher than a transmittance for the luminescence; and
- an optical layer stack that is arranged closer to the liquid crystal display panel than the phosphor layer;

the optical layer stack, the phosphor layer and the wavelength-selective reflection layer are integrally secured to the back surface of the liquid crystal display panel via a plurality of adhesive layers including a first adhesive layer; and an absorbing member that absorbs the luminescence is provided in areas of the front surface of the LED substrate between the plurality of LED chips.

* * * * *